United States Patent
Na et al.

(10) Patent No.: US 12,113,141 B2
(45) Date of Patent: Oct. 8, 2024

(54) OPTICAL-SENSING APPARATUS

(71) Applicant: ARTILUX, INC., Menlo Park, CA (US)

(72) Inventors: Yun-Chung Na, San Jose, CA (US); Chien-Yu Chen, Zhubei (TW); Yen-Ju Lin, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 220 days.

(21) Appl. No.: 17/743,005

(22) Filed: May 12, 2022

(65) Prior Publication Data

US 2022/0376125 A1 Nov. 24, 2022

Related U.S. Application Data

(60) Provisional application No. 63/190,827, filed on May 20, 2021.

(51) Int. Cl.
*H01L 31/0352* (2006.01)
*H01L 27/144* (2006.01)
*H01L 31/107* (2006.01)
*H01L 31/112* (2006.01)

(52) U.S. Cl.
CPC .. *H01L 31/035272* (2013.01); *H01L 27/1446* (2013.01); *H01L 31/107* (2013.01); *H01L 31/112* (2013.01)

(58) Field of Classification Search
CPC .......... H01L 31/035272; H01L 31/107; H01L 31/112; H01L 31/1075; H01L 27/1446
See application file for complete search history.

(56) References Cited

U.S. PATENT DOCUMENTS

| | | | |
|---|---|---|---|
| 2018/0197910 A1* | 7/2018 | Lee | H04N 25/771 |
| 2019/0027532 A1* | 1/2019 | Margutti | H01L 27/14698 |
| 2019/0312158 A1* | 10/2019 | Chen | H01L 27/1443 |
| 2021/0066529 A1 | 3/2021 | Lu et al. | |

FOREIGN PATENT DOCUMENTS

KR 100833605 B1 * 5/2008

* cited by examiner

*Primary Examiner* — Sitaramarao S Yechuri
(74) *Attorney, Agent, or Firm* — Fish & Richardson P.C.

(57) ABSTRACT

An optical sensing apparatus is provided. The optical sensing apparatus includes a substrate, one or more pixels supported by the substrate, where each of the one or more pixels includes an absorption region, a field control region, a first contact region, a second contact region and a carrier confining region. The field control region and the first contact region are doped with a dopant of a first conductivity type. The second contact region is doped with a dopant of a second conductivity type. The carrier confining region includes a first barrier region and a channel region, where the first barrier region is doped with a dopant of the second conductivity type and has a first peak doping concentration, and where the channel region is intrinsic or doped with a dopant of the second conductivity type and has a second peak doping concentration lower than the first peak doping concentration.

20 Claims, 12 Drawing Sheets

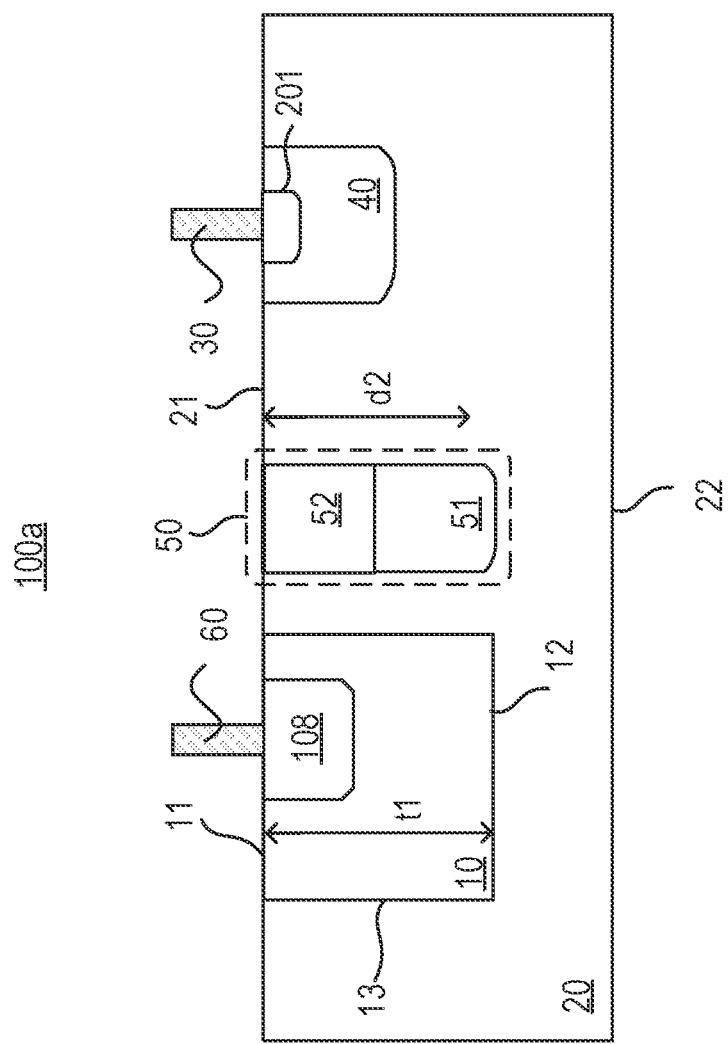

OPTICAL-SENSING APPARATUS

CROSS-REFERENCE TO RELATED APPLICATION

This application claims the benefit of U.S. Provisional Patent Application No. 63/190,827, filed May 20, 2021, which is incorporated by reference herein in its entirety.

BACKGROUND

This application relates to a sensor, and more particularly, to an optical sensor.

Sensors are being used in many applications, such as smartphones, robotics, autonomous vehicles, proximity sensing, biometric sensing, image sensors, high-speed optical receiver, data communications, direct/indirect time-of-flight (TOF) ranging or imaging sensors, medical devices, etc. for object recognition, image enhancement, material recognition, and other relevant applications.

SUMMARY

One example aspect of the present disclosure is directed to an optical sensing apparatus. The optical sensing apparatus can include a substrate composed of a first material and having a first surface. The optical sensing apparatus can further include one or more pixels supported by the substrate, where each of the one or more pixels includes an absorption region, a field control region, a first contact region, a second contact region and a carrier confining region. The absorption region supported by the substrate and composed of a second material, the absorption region configured to receive an optical signal and generate photo-carriers in response to receiving the optical signal. The field control region formed in the substrate, where the field control region is doped with a dopant of a first conductivity type. The first contact region formed in the substrate for collecting a first type of the photo-carriers, where the first contact region is electrically coupled to the field control region and is doped with a dopant of the first conductivity type. The second contact region electrically coupled to the absorption region for collecting a second type of the photo-carriers, where the second contact region is doped with a dopant of a second conductivity type. The carrier confining region formed in the substrate and between the absorption region and the field control region, where the carrier confining region includes a first barrier region and a channel region, where the first barrier region is doped with a dopant of the second conductivity type and has a first peak doping concentration, and where the channel region is intrinsic or doped with a dopant of the second conductivity type and has a second peak doping concentration lower than the first peak doping concentration of the first barrier region, where the absorption region, the field control region, and the carrier confining region are formed along the first surface of the substrate, and where the channel region is formed between the first barrier region and the first surface of the substrate.

In some embodiments, the absorption region is fully embedded in the substrate, and a ratio of a distance and a thickness of the absorption region is between 0.5 and 1.2, where the distance is between the first surface of the substrate and a position where the first peak doping concentration of the first barrier region locates.

In some embodiments, the carrier confining region further includes a second barrier region doped with a dopant of the second conductivity and having a third peak doping concentration higher than the second peak doping concentration of the channel region, where the channel region is formed between the first barrier region and the second barrier region.

In some embodiments, the optical sensing apparatus can further include a protection region formed between the carrier confining region and the first contact region, where the protection region is doped with a dopant of the second conductivity type and is configured to repel the first type of the photo-carriers from reaching the first surface of the substrate.

In some embodiments, the optical sensing apparatus can further include a counter-doped region surrounding at least a part of the carrier confining region, where the counter-doped region is doped with a dopant of the first conductivity type.

In some embodiments, the optical sensing apparatus can further include a carrier extraction region formed between the absorption region and the carrier confining region, where the carrier extraction region is doped with a dopant of the first conductivity type and is configured to extract the first type of the photo-carriers from the absorption region.

In some embodiments, the counter-doped region has a peak doping concentration between a peak doping concentration of the carrier extraction region and a peak doping concentration of the field control region, and where the peak doping concentration of the field control region is higher than the peak doping concentration of the counter-doped region.

In some embodiments, the optical sensing apparatus can further include one or more third contact regions formed in the carrier confining region, where the one or more third contact regions are doped with a dopant of the second conductivity type.

In some embodiments, the optical sensing apparatus can further include a counter-doped region surrounding at least a part of the carrier confining region, where the counter-doped region is doped with a dopant of the first conductivity type and is configured to reduce a leakage current between the carrier confining region and the second contact region.

In some embodiments, the optical sensing apparatus can further include a carrier extraction region formed between the absorption region and the carrier confining region, where the carrier extraction region is doped with a dopant of the first conductivity type and is configured to extract the first type of the photo-carriers from the absorption region.

In some embodiments, the counter-doped region has a peak doping concentration between a peak doping concentration of the carrier extraction region and a peak doping concentration of the field control region, where the peak doping concentration of the field control region is higher than the peak doping concentration of the counter-doped region.

In some embodiments, the one or more third contact regions includes two or more third contact regions, and the optical sensing apparatus can further include two or more third electrodes each electrically coupled to a respective third contact region of the third contact regions, where the two or more third electrodes are configured to apply a constant voltage on the carrier confining region, and where a ratio of a distance between two of the third electrodes to a width of the absorption region is not less than 0.5.

In some embodiments, the optical sensing apparatus can further include a first electrode coupled to the first contact region and a second electrode coupled to the second contact region, where at or above a breakdown voltage applied between the first electrode and the second electrode, the channel region acts as a punch-through region and a region between the carrier confining region and the field control region acts as a breakdown region, such that the optical sensing apparatus functions as an avalanche phototransistor or a single-photon avalanche phototransistor.

In some embodiments, the absorption region is doped with a dopant of the second conductivity type.

In some embodiments, the absorption region has a gradient doping profile.

In some embodiments, the optical sensing apparatus can further include a first electrode coupled to the first contact region and a second electrode coupled to the second contact region, where at or above a breakdown voltage applied between the first electrode and the second electrode, the channel region acts as a punch-through region and a region between the field control region and the carrier confining region acts as a breakdown region, such that the optical sensing apparatus functions as an avalanche photodiode or a single-photon avalanche diode.

In some embodiments, the substrate is doped with a dopant of the second conductivity type.

In some embodiments, the optical sensing apparatus can further include an isolation structure between two adjacent pixels.

In some embodiments, the isolation structure is formed on the first surface of the substrate.

In some embodiments, the isolation structure is formed on a second surface of the substrate that is opposite to the first surface.

BRIEF DESCRIPTION OF THE DRAWINGS

The foregoing aspects and many of the advantages of this application will become more readily appreciated as the same becomes better understood by reference to the following detailed description, when taken in conjunction with the accompanying drawings:

FIGS. 1A-1C illustrates cross-sectional views of an optical sensing apparatus, according to some embodiments.

DETAILED DESCRIPTION

Figure 1B:
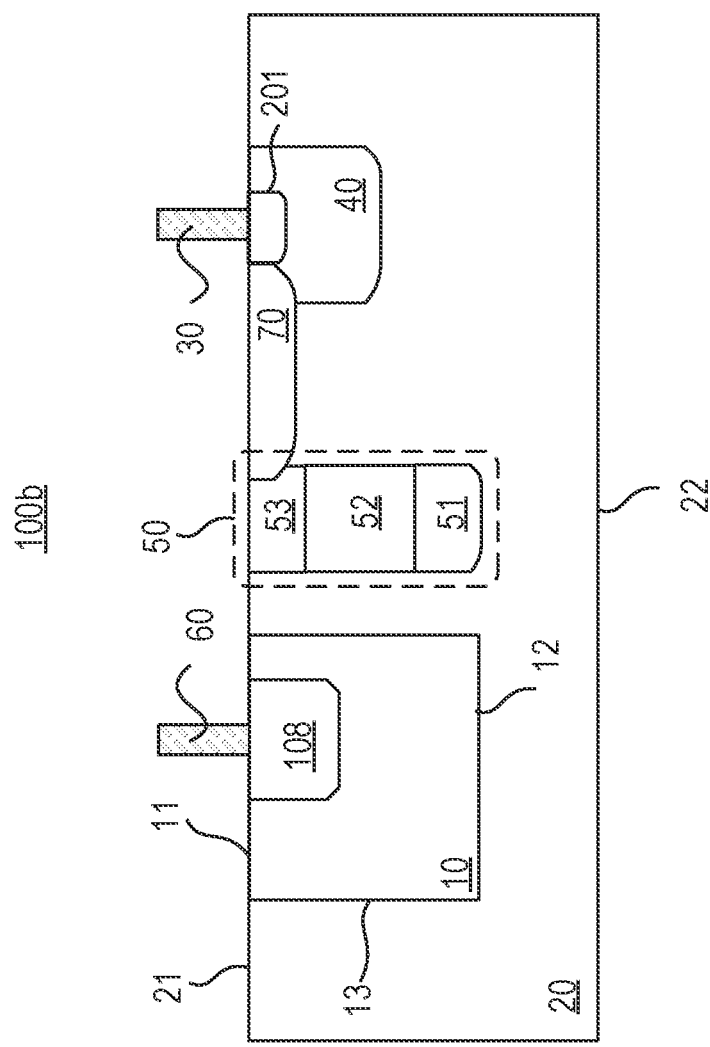

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the term "intrinsic" means that the semiconductor material is without intentionally adding dopants.

Referring to FIG. 1A to FIG. 3D, an optical sensing apparatus 100a, 100b, 100c, 200a, 200d, 300a, 300c, 300d is disclosed.

FIG. 1A illustrates a cross-sectional view of an optical sensing apparatus 100a, according to some embodiments. The optical sensing apparatus 100a includes a substrate 20 composed of a first material (e.g., Si) and having a first surface 21, and one or more pixels (e.g., 300d1, 300d2 as described in detail below along with FIG. 3D) supported by the substrate 20, where each of the pixel includes an absorption region 10 supported by the substrate 20 and composed of a second material (e.g., Ge). In some embodiments, a bandgap of the first material is greater than a bandgap of the second material. The absorption region 10 is configured to receive an optical signal and generate photo-carriers in response to receiving the optical signal. In some embodiments, the absorption region 10 includes a first surface 11, a second surface 12 opposite to the first surface 11, and one or more side surfaces 13 between the first surface 11 and the second surface 12. The optical sensing apparatus 100a further includes a field control region 40 formed in the substrate 20, where the field control region 40 is doped with a dopant of a first conductivity type (e.g., n-type). The optical sensing apparatus 100a further include a first contact region 201 formed in the substrate 20 for collecting a first type of the photo-carriers (e.g., electrons), where the first contact region 201 is electrically coupled to the field control region 40 and is doped with a dopant of the first conductivity type (e.g., n-type). The optical sensing apparatus 100a further include a second contact region 108 electrically coupled to the absorption region 10 for collecting a second type of the photo-carriers (e.g., holes), where the second contact region 108 is doped with a dopant of a second conductivity type (e.g., p-type). In some embodiments, the second contact region 108 is formed in the absorption region 10. The optical sensing apparatus 100a further include a carrier confining region 50 formed in the substrate 20 and between the absorption region 10 and the field control region 40, where the carrier confining region 50 includes a first barrier region 51 and a channel region 52, where the first barrier region 51 is doped with a dopant of the second conductivity type (e.g., p-type) and has a first peak doping concentration (e.g., no less than $1\times10^{15}$ cm$^{-3}$ such as between $1\times10^{16}$ cm$^{-3}$ and $5\times10^{18}$ cm$^{-3}$), and where the channel region 52 is intrinsic or doped with a dopant of the second conductivity type (e.g., p-type) and has a second peak doping concentration (e.g., no more than $1\times10^{17}$ cm$^{-3}$) lower than the first peak doping concentration of the first barrier region 51. The absorption region 10, the field control region 40, and the carrier confining region 50 are formed along the first surface 21 of the substrate 20, where the channel region 52 is formed between the first barrier region 51 and the first surface 21 of the substrate 20. In some embodiments, the carrier confining region 50 is floated.

In some embodiments, the dopant of the first contact region 201 has a peak doping concentration (e.g., no less than $1\times10^{18}$ cm$^{-3}$ such as between $1\times10^{18}$ cm$^{-3}$ and $1\times10^{20}$ cm$^{-3}$). In some embodiments, the dopant of the field control region 40 has a peak doping concentration not more than the peak doping concentration of the first contact region 201, for example, the peak doping concentration of the field control region 40 can be no more than $1\times10^{19}$ cm$^{-3}$ such as between $5\times10^{17}$ cm$^{-3}$ and $5\times10^{18}$ cm$^{-3}$. In some embodiments, the dopant of the second contact region 108 has a peak doping concentration (e.g., no less than $1\times10^{18}$ cm$^{-3}$ such as between $1\times10^{18}$ cm$^{-3}$ and $1\times10^{20}$ cm$^{-3}$).

In some embodiments, the dopant of the first barrier region 51 may diffuse into the channel region 52. Accordingly, even if the channel region 52 is intrinsic, the channel region 52 may be slightly doped with the dopant of the first barrier region 51 but with a doping concentration lower than the first peak doping concentration of the first barrier region 51.

In some embodiments, the optical sensing apparatus 100a further includes a first electrode 30 electrically coupled to the first contact region 201 and configured to electrically connect to an external power source (e.g., a voltage node that supplies a variable reverse-bias voltage). In some embodiments, the optical sensing apparatus 100a further includes a second electrode 60 electrically coupled to the second contact region 108 and configured to electrically connect to an external power source (e.g., ground).

In some embodiments, the optical sensing apparatus 100a is operated under reverse bias at or above a breakdown voltage applied between the first electrode 30 and the second electrode 60. The channel region 52 here acts as a punch-through region, as the electric field generated by the depletion region between the channel region 52 and the absorption region 10 allows the first type of carriers (e.g., electrons) to be extracted from the absorption region 10 to the channel region 52. Since the peak doping concentration of the first barrier region 51 is higher than the peak doping concentration of the channel region 52, the first barrier region 51 acts as a carrier barrier for the first type of carriers (e.g., electrons). A region between the field control region 40 and the carrier confining region 50 acts as a breakdown region for multiplying the first type of carriers. Since the carrier-multiplication region is formed in the substrate 20 comprising the first material having the bandgap greater than the bandgap of the second material, the dark current can be reduced. Accordingly, the optical sensing apparatus 100a may function as an avalanche photodiode or a single-photon avalanche diode with a low dark current that can be formed along a surface of a wafer.

In some embodiments, the optical sensing apparatus 100a can be applied to a direct TOF system. For example, a timing where a single-photon avalanche diode generates a positive signal (e.g., a threshold number of photons received) can be compared with a timing where a laser pulse was generated by a light source to determine depth information associated with a target object.

In some embodiments, the carrier confining region 50 as a whole can block the first type of the photo-carriers (e.g., electrons) from flowing directly toward the first contact region 201. When the reverse bias voltage reaches the breakdown voltage, the channel region 52 acts as a punch-through region to let the first type of the photo-carriers (e.g., electrons) pass through while the first barrier region 51 still blocks the first type of the photo-carriers (e.g., electrons).

By having the carrier confining region 50 formed in the substrate 20 and between the absorption region 10 and the field control region 40, the carrier confining region 50 can block the first type of the photo-carriers (e.g., electrons) from flowing directly toward the first contact region 201 when the optical sensing apparatus 100a is operated under the breakdown voltage, which reduces dark current generated of the optical sensing apparatus 100a before the breakdown occurs.

By having the carrier confining region 50 includes a first barrier region 51 and a channel region 52, where the first peak doping concentration of the first barrier region 51 is higher than the doping concentration of the channel region 52, the first type of the photo-carriers (e.g., electrons) can flow through the channel region 52 but still be blocked by the first barrier region 51 when the optical sensing apparatus 100a is operated under reverse bias at or above a breakdown voltage. Accordingly, the first type of the photo-carriers (e.g., electrons) can be confined within a certain path and then move into the region between the field control region 40 and the carrier confining region 50 where the stronger electric field locates. That is, the region acts as a breakdown region, which is capable of generating one or more additional charge carriers in response to receiving the first type of the photo-carriers generated from the absorption region 10 through impact ionization, which starts the chain reaction of avalanche multiplication. As a result, the optical sensing apparatus 100a has a gain.

In some embodiments, the absorption region 10 is fully embedded in the substrate 20, and a ratio of a distance d2 and a thickness t1 of the absorption region 10 is between 0.5 and 1.2, where the distance d2 is between the first surface 21 of the substrate 20 and a position where the first peak doping concentration of the first barrier region 51 locates. By properly designing the ratio of the distance d2 and the thickness t1 of the absorption region 10, the dark current generated of the optical sensing apparatus 100a before the breakdown occurs can be reduced and the first type of the photo-carriers (e.g., electrons) can be confined to flow into the region where the stronger electric field locates more efficiently, which increases the gain of the optical sensing apparatus 100a.

FIG. 1B illustrates cross-sectional views of an optical sensing apparatus 100b, according to some embodiments. Like reference numbers and designations indicate like elements as mentioned above. The optical sensing apparatus 100b is similar to the optical sensing apparatus 100a as described above, and the differences are described below. Referring to FIG. 1B, the carrier confining region 50 further includes a second barrier region 53 doped with a dopant of the second conductivity (e.g., p-type) and having a third peak doping concentration (e.g., no less than $1\times10^{15}$ cm$^{-3}$ such as between $1\times10^{16}$ cm$^{-3}$ and $5\times10^{18}$ cm$^{-3}$) higher than the second peak doping concentration of the channel region 52, where the channel region 52 is formed between the first barrier region 51 and the second barrier region 53. The second barrier region 53 has a similar function as the first barrier region 51 for controlling the flow of the carriers in the carrier confining region 50, and further prevents carriers from reaching the surface 21 of the substrate 20.

In some embodiments, the dopant of the second barrier region 53 may diffuse into the channel region 52. Accordingly, even if the channel region 52 is intrinsic, the channel region 52 may be slightly doped with the dopant of the second barrier region 53 but with a doping concentration lower than the third peak doping concentration of the second barrier region 53.

In some embodiments, the optical sensing apparatus 100b further includes a protection region 70 formed between the carrier confining region 50 and the first contact region 201, where the protection region 70 is doped with a dopant of the second conductivity type (e.g., p-type) and is configured to prevent the high electric field at breakdown to reach the first surface 21 as well as to repel the first type of the photo-carriers (e.g., electrons) from reaching the first surface 21 of the substrate 20, which improves the performance of the optical sensing apparatus 100b by avoiding surface break down or surface leakage since there may be many defects at the first surface 21 of the substrate 20.

In some embodiments, the protection region 70 is doped with a peak doping concentration not less than $1 \times 10^{15}$ cm$^{-3}$ such as between $1 \times 10^{16}$ cm$^{-3}$ and $5 \times 10^{18}$ cm$^{-3}$. In some embodiments, the protection region 70 and the second barrier region 53 can be formed in the same process step, such as the same implantation step. In some embodiments, the absorption region 10, the field control region 40, the protection region 70 and the carrier confining region 50 are formed along the first surface 21 of the substrate 20.

Figure 1C:
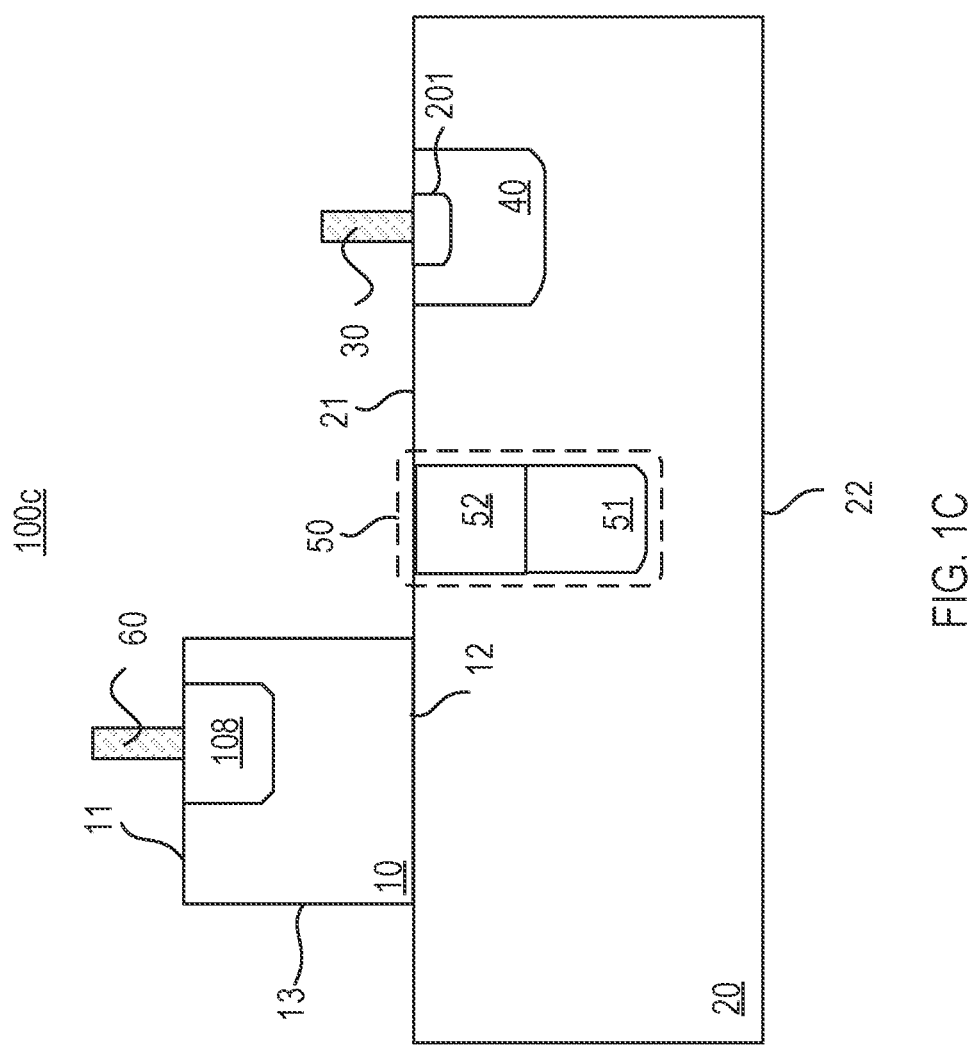

FIG. 1C illustrates cross-sectional views of an optical sensing apparatus 100c, according to some embodiments. Like reference numbers and designations indicate like elements as mentioned above. The optical sensing apparatus 100c is similar to the optical sensing apparatus 100a as described above, and the differences are described below. In some embodiments, the absorption region 10 is formed over the substrate 20. In some embodiments, the absorption region 10 is partially embedded in the substrate 20.

Figure 2A:
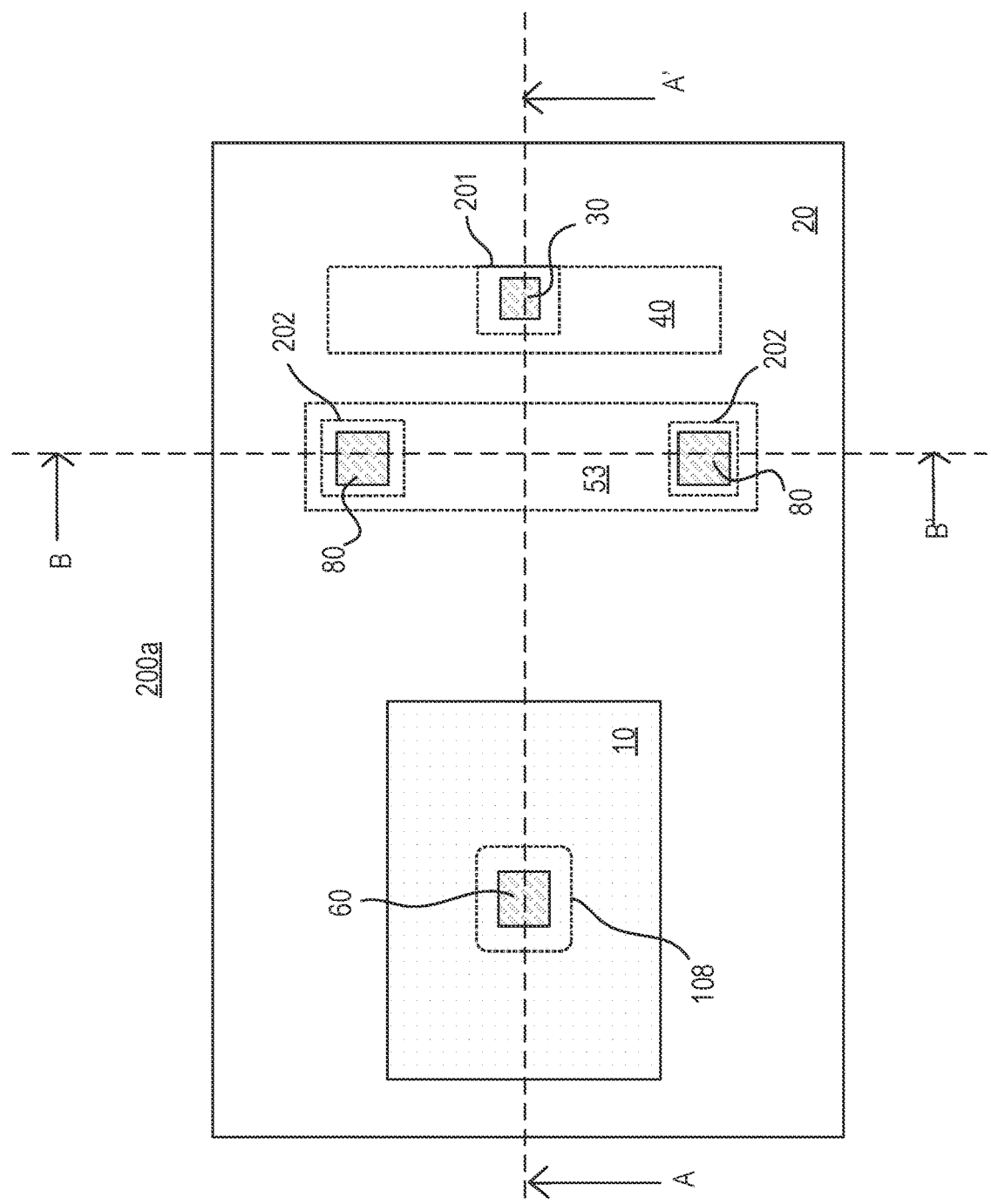
FIG. 2A illustrates a top view of an optical sensing apparatus, according to some embodiments.
Figure 2B:
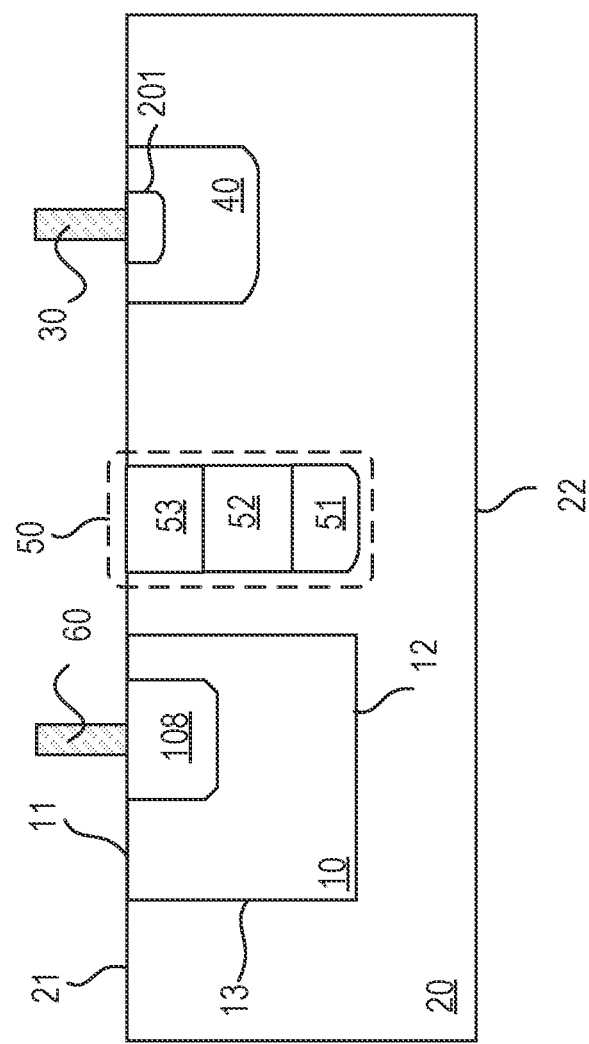
FIG. 2B illustrates a cross-sectional view along an A-A' line in FIG. 2A, according to some embodiments.
Figure 2C:
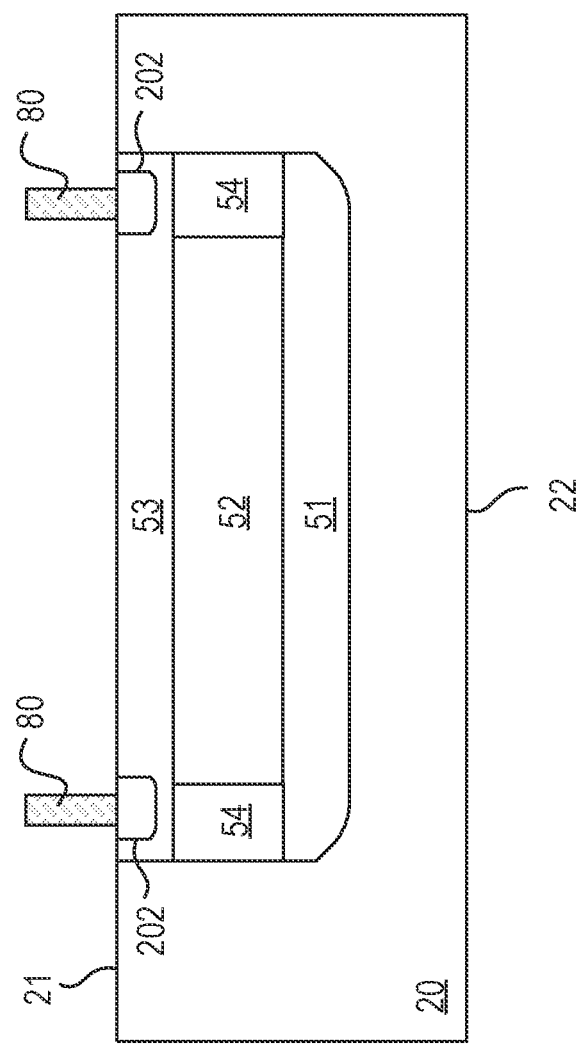
FIG. 2C illustrates a cross-sectional view along a B-B' line in FIG. 2A, according to some embodiments.

FIG. 2A illustrates a top view of an optical sensing apparatus 200a, according to some embodiments. FIG. 2B illustrates a cross-sectional view along an A-A' line in FIG. 2A, according to some embodiments. FIG. 2C illustrates a cross-sectional view along a B-B' line in FIG. 2A, according to some embodiments. Like reference numbers and designations indicate like elements as mentioned above. The optical sensing apparatus 100c is similar to the optical sensing apparatus 100a as described above, and the differences are described below.

Referring to FIG. 2A and FIG. 2C, in some embodiments, the optical sensing apparatus 200a further includes one or more third contact regions 202 formed in the carrier confining region 50, where the one or more third contact regions 202 are doped with a dopant of the second conductivity type (e.g., p-type).

In some embodiments, the dopant of the third contact regions 202 has a peak doping concentration (e.g., no less than $1 \times 10^{18}$ cm$^{-3}$ such as between $1 \times 10^{18}$ cm$^{-3}$ and $1 \times 10^{20}$ cm$^{-3}$).

Referring to FIG. 2A and FIG. 2C, in some embodiments, the optical sensing apparatus 200a further includes two or more third contact regions 202 formed in the carrier confining region 50 and the optical sensing apparatus 200a further includes two or more third electrodes 80 each electrically coupled to a respective third contact region 202 of the third contact regions 202, where the two or more third electrodes 80 can be configured to apply a constant voltage on the carrier confining region 50.

By having the third electrodes 80 and the third contact regions 202, the voltage applied to the carrier confining region 50 can be controlled. Therefore, the breakdown voltage of the optical sensing apparatus 200a can be further controlled.

In some embodiments, the optical sensing apparatus 200i functions as an avalanche phototransistor or a single-photon avalanche phototransistor. Similarly, referring to FIG. 2B, the region between the field control region 40 and the carrier confining region 50 where the stronger electric field locates acts as a breakdown region, which is capable of multiplying charge carriers in response to receiving the first type of the photo-carriers generated from the absorption region 10 through impact ionization, which starts the chain reaction of avalanche multiplication. As a result, the optical sensing apparatus has a gain.

Referring to FIG. 2C, in some embodiments, the third contact region(s) 202 is formed in the second barrier region 53 FIG.

Referring to FIG. 2C, in some embodiments, the optical sensing apparatus 200a further includes conductive region 54 electrically coupled to the first barrier region 51 and the second barrier region 53, where the channel region 52 is surrounded by the first barrier region 51, the second barrier region 53 and the conductive region 54.

In some embodiments, the conductive region 54 is doped with a dopant of the second conductivity type (e.g., p-type) and has a fourth peak doping concentration higher than the second peak doping concentration of the channel region 52. The conductive region 54 is configured to connect the first barrier region 51 to the second barrier region 53 and also confine the first type of the photo-carriers (e.g., electrons) within a predetermined region in the substrate 20.

Figure 2D:
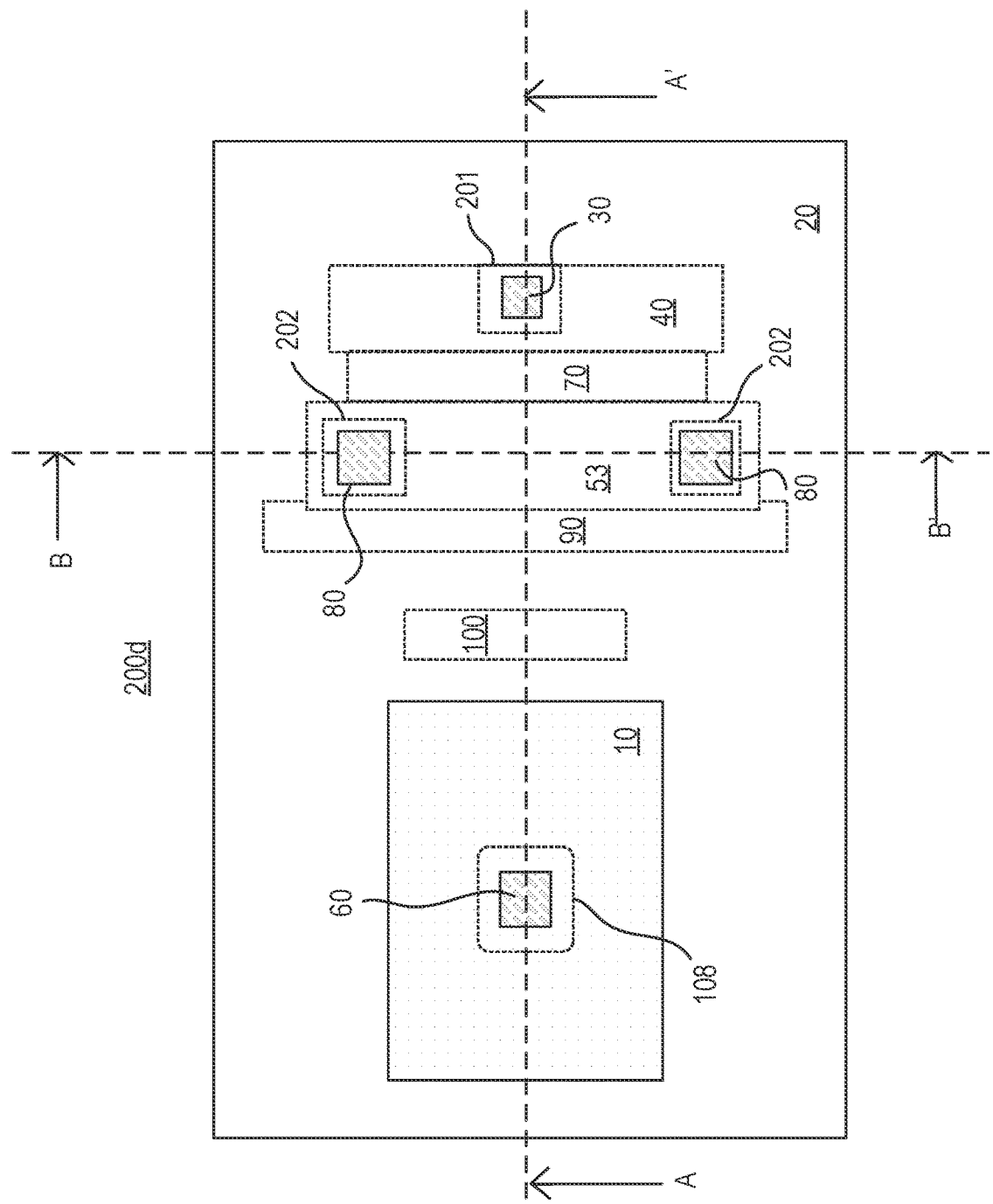
FIG. 2D illustrates a top view of an optical sensing apparatus, according to some embodiments.
Figure 2E:
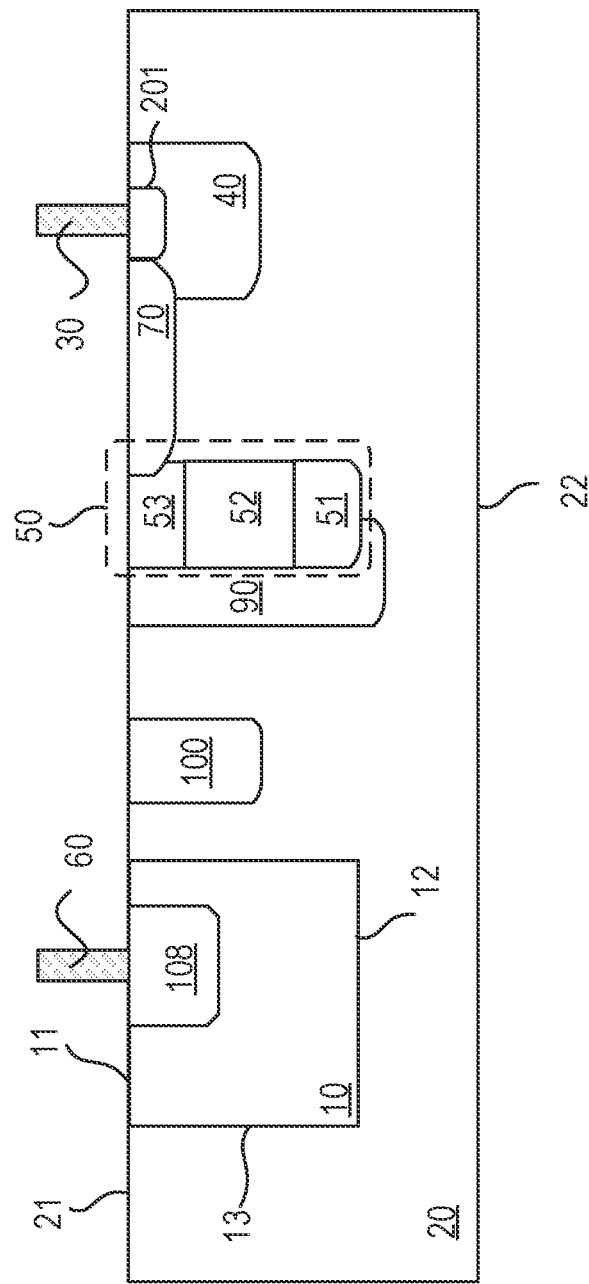
FIG. 2E illustrates a cross-sectional view along a A-A' line in FIG. 2D, according to some embodiments.

FIG. 2D illustrates a top view of an optical sensing apparatus 200d, according to some embodiments. FIG. 2E illustrates a cross-sectional view along a A-A' line in FIG. 2D, according to some embodiments. The cross-sectional view along a B-B' line in FIG. 2D may be similar to FIG. 2C. Like reference numbers and designations indicate like elements as mentioned above. Referring to FIG. 2D to FIG. 2E, in some embodiments, the optical sensing apparatus 200d further includes a counter-doped region 90 surrounding at least a part of the carrier confining region 50 or partially overlapping with the carrier confining region 50, where the counter-doped region 90 is doped with a dopant of the first conductivity type (e.g., n-type). The counter-doped region 90 can help reduce a leakage current between the third contact regions 202 and the second contact region 108.

In some embodiments, the carrier confining region 50 can be entirely surrounded by or overlapped with the counter-doped region 90.

In some embodiments, the counter-doped region 90 is doped with a peak doping concentration lower than the peak doping concentration of the field control region 40, for example, the peak doping concentration of the counter-doped region 90 can be no less than $5 \times 10^{15}$ cm$^{-3}$ such as between $1 \times 10^{16}$ cm$^{-3}$ and $1 \times 10^{18}$ cm$^{-3}$.

Referring to FIG. 2D to FIG. 2E, in some embodiments, the optical sensing apparatus 200d further including a carrier extraction region 100 formed between the absorption region 10 and the carrier confining region 50, where the carrier extraction region 100 is doped with a dopant of the first conductivity type (e.g., n-type) and is configured to extract the first type of the photo-carriers (e.g., electrons) from the absorption region 10. Accordingly, more first type of the photo-carriers (e.g., electrons) can be guided into the breakdown region when the optical sensing apparatus 200d is operated at or above the breakdown voltage.

In some embodiments, the carrier extraction region 100 is with a peak doping concentration not less than $1 \times 10^{15}$ cm$^{-3}$ such as between $5 \times 10^{15}$ cm$^{-3}$ and $5 \times 10^{17}$ cm$^{-3}$.

In some embodiments, the peak doping concentration of the counter-doped region 90 is between the peak doping concentration of the carrier extraction region 100 and the peak doping concentration of the field control region 40, and the peak doping concentration of the field control region 40 is higher than the peak doping concentration of the counter-doped region 90.

Figure 3A:
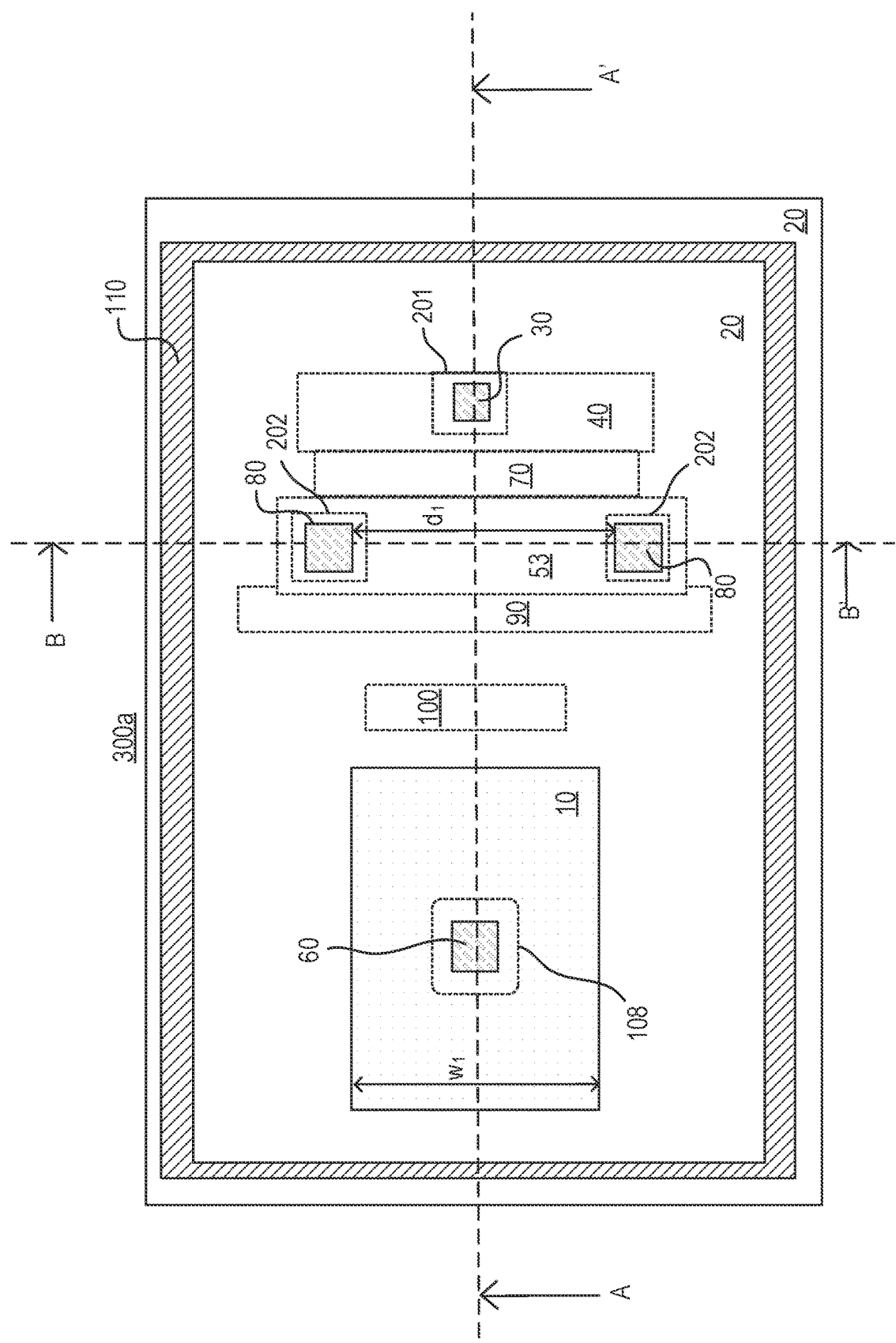
FIG. 3A illustrates a top view of an optical sensing apparatus, according to some embodiments.
Figure 3B:
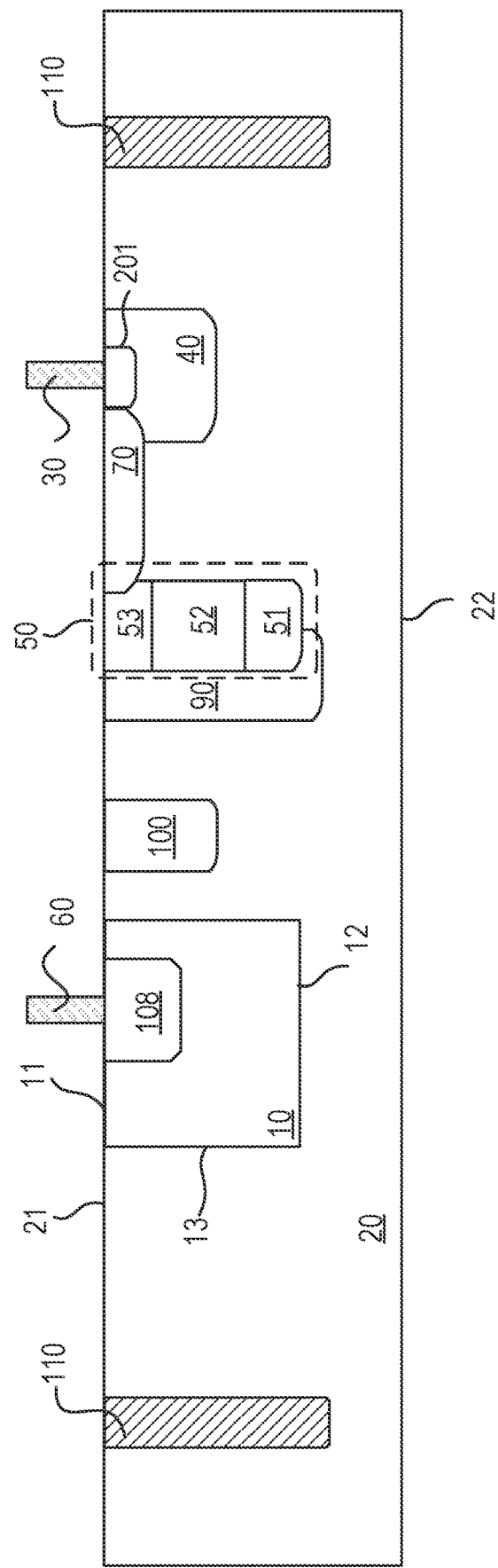
FIG. 3B illustrates a cross-sectional view along an A-A' line in FIG. 3A, according to some embodiments.

FIG. 3A illustrates a top view of an optical sensing apparatus 300a, according to some embodiments. FIG. 3B illustrates a cross-sectional view along an A-A' line in FIG. 2A, according to some embodiments. Like reference numbers and designations indicate like elements as mentioned above. Referring to FIG. 3A to FIG. 3B, in some embodiments, the optical sensing apparatus 300a further includes an isolation structure 110 between two adjacent pixels 300d1, 300d2.

In some embodiments, the isolation structure 110 is formed on the first surface 21 of the substrate 20. In some embodiments, the isolation structure 110 extends from the first surface 21 of the substrate 20 and extends into a predetermined depth from the first surface 21 (e.g., as shown in FIG. 3B). In some embodiments, the isolation structure 110 penetrates though the substrate 20 from the first surface 21 and the second surface 22. In some embodiments, the isolation structure 110 is disposed at two opposite sides of the absorption region 10 from a cross-sectional view of the optical sensing apparatus. In some embodiments, the shape of the isolation structure 110 may be a ring. In some embodiments, the isolation structure 110 may include two discrete regions disposed at the at two opposite sides of the absorption region 10.

Referring to FIG. 3A, in some embodiments, a ratio of a distance d1 between two of the third electrodes 80 to a width w1 of the absorption region 10 is not less than 0.5.

By properly designing the ratio of a distance d1 between two of the third electrodes 80 to the width w1 of the absorption region 10, the electric field can be more evenly distributed between the second contact region 108 and the first contact region 201, which improves the multiplication effects during the operation of the optical sensing apparatus 300a.

In some embodiments, a cross-sectional view along a B-B' line in FIG. 3A is similar to FIG. 2C except that the isolation structure 110 is disposed at two opposite sides of the two or more third electrodes 80.

Figure 3C:
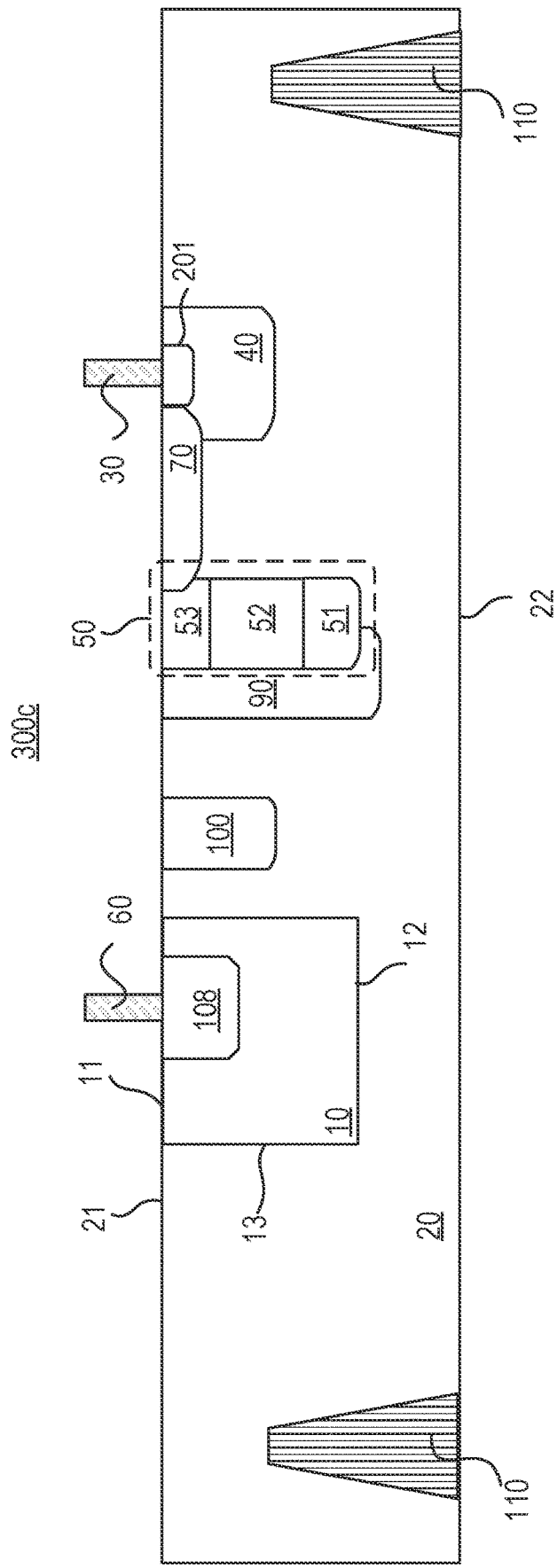
FIG. 3C illustrates a cross-sectional view along an A-A' line in FIG. 3A, according to some embodiments.

FIG. 3C illustrates a cross-sectional view along an A-A' line in FIG. 3A, according to some embodiments. Like reference numbers and designations indicate like elements as mentioned above. In some embodiments, the isolation structure 110 of the optical sensing apparatus 300c is formed on a second surface 22 of the substrate 20 that is opposite to the first surface 21. In some embodiments, the isolation structure 110 extends from the second surface 22 of the substrate 20 and extends into a predetermined depth from the second surface 22.

Figure 3D:
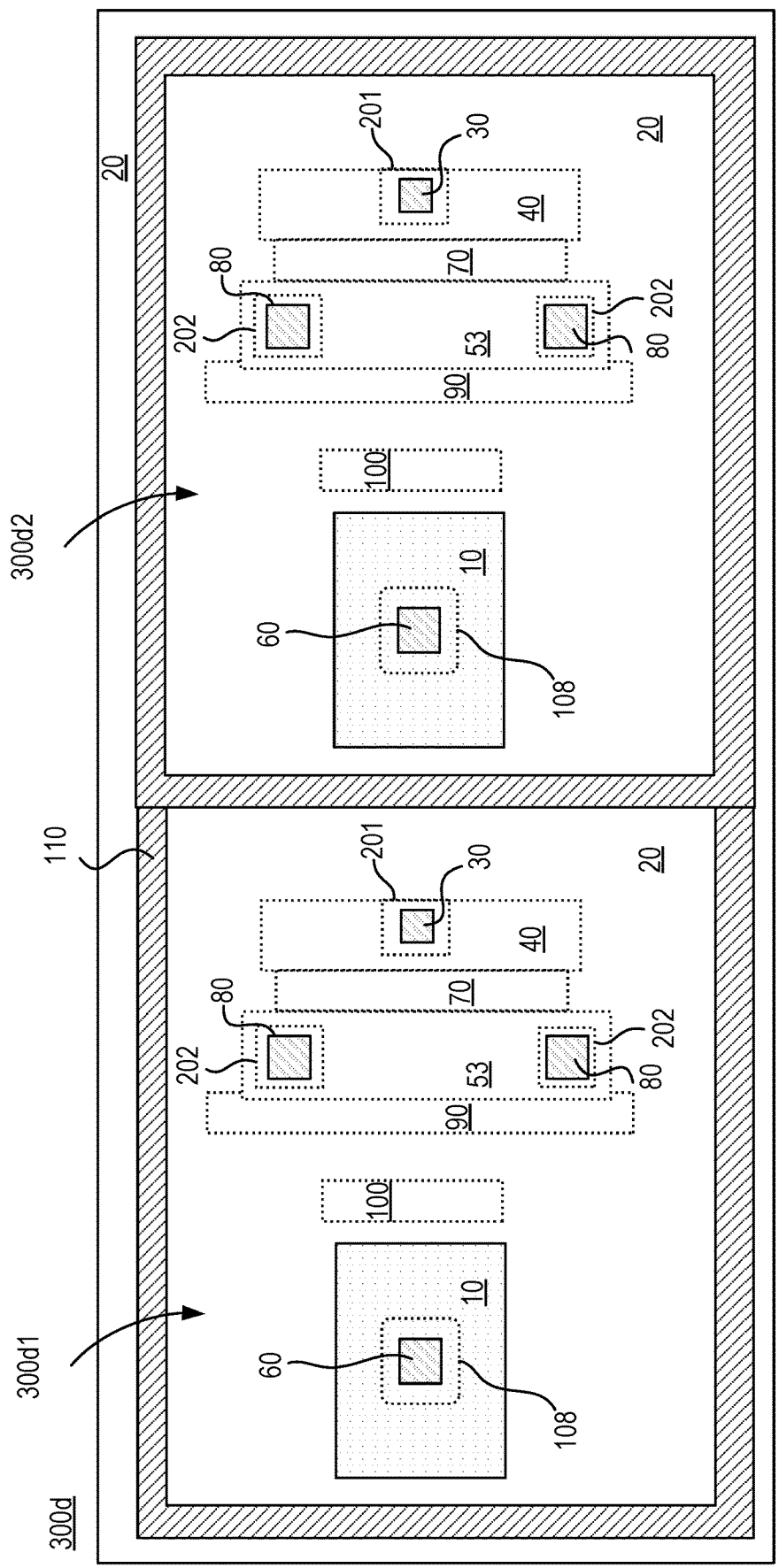
FIG. 3D illustrates a top view of an optical sensing apparatus, according to some embodiments.

FIG. 3D illustrates a top view of an optical sensing apparatus 300d, according to some embodiments. Like reference numbers and designations indicate like elements as mentioned above. The optical sensing apparatus 300d includes two pixels 300d1, 300d2. In some embodiments, the isolation structure 110 is a trench filled with a dielectric material or an insulating material to serve as a region of high electrical resistance between the two adjacent pixels 300d1, 300d2 FIG, impeding a flow of current across the isolation structure 110 and improving electrical isolation between the adjacent pixels 300d1, 300d2. The dielectric material or an insulating material may include, but is not limited to oxide material including SiO2 or nitride material including Si3N4 or silicon material including amorphous-Si/poly-Si/crystal-Si/epitaxial-Si.

In some embodiments, the isolation structure 110 is a doped region with a dopant having a conductivity type (e.g., p-type or n-type). The doping of the isolation structure 110 may create a bandgap offset-induced potential energy barrier that impedes a flow of current across the isolation structure 110 and improving electrical isolation between the adjacent pixels 300d1, 300d2. In some embodiments, the isolation structure 110 includes a semiconductor material that is different from the material of the substrate 20. An interface between two different semiconductor materials formed between the substrate 20 and the isolation structure 110 may create a bandgap offset-induced energy barrier that impedes a flow of current across the isolation structure 110 and improving electrical isolation between the adjacent pixels 300d1, 300d2.

It should be understood that the elements mentioned in the present disclosure can be combined in any manner and in any number to create additional embodiments. For example, the absorption region 10 of optical sensing apparatus 200a, 200d, 200e can be over the first surface 21 of the substrate 20, as described in FIG. 1C. For another example, the optical sensing apparatus 100a, 100b can also include the counter-doped region 90 and/or the carrier extraction region 100 as described in FIG. 3A and FIG. 3B.

In the present disclosure, the absorption region 10 in any embodiment described herein is doped with a dopant of the second conductivity type (e.g., p-type). The absorption region 10 is with a peak doping concentration such as between $1 \times 10^{17}$ cm$^{-3}$ and $1 \times 10^{19}$ cm$^{-3}$, which further reduces the dark current of the optical sensing apparatus e.g., 100a, 100b, 100c, 200a, 200d, 300a, 300c, 300d. In some embodiments, the absorption region 10 has a gradient doping profile. For example, the gradient doping profile can be graded from the first surface 11 of the absorption region 10 or from the second contact region 108 to the second surface 12 of the absorption region 10. In some embodiments, the gradient doping profile can be a gradual decrease/increase or a step like decrease/increase depending on the moving direction of the carriers. In some embodiments, the concentration of the gradient doping profile is gradually deceased/increased from the first surface 11 or the second contact region 108 of the absorption region 10 to the second surface 12 of the absorption region 10 depending on the moving direction of the carriers. In some embodiments, the concentration of the gradient doping profile is gradually and radially deceased/increased from a center of the first surface 11 or the second contact region 108 of the absorption region 10 to the second surface 12 and to the one or more side surfaces 13 of the absorption region 10 depending on the moving direction of the carriers. For example, when the second contact region 108 is of p-type, electrons move in the absorption region 10 substantially along a direction from the first surface 11 to the second surface 12. The concentration of the gradient doping profile of the dopant in the absorption region 10 (e.g., boron) is gradually deceased from the first surface 11 or from the second contact region 108 of the absorption region 10 to the second surface 12 of the absorption region 10. In some embodiments, the concentration of the gradient doping profile is gradually and laterally decreased/increased from an edge of the first surface 11 or the second contact region 108 of the absorption region 10 to the side surfaces 13 of the absorption region 10 depending on the moving direction of the carriers. In some embodiments, the second contact region 108 is formed in the substrate 20 and in contact with the absorption region 10 so as to collect the second type of the photo-carriers. In some embodiments, the second electrode 60 is over the first surface 21 of the substrate 20 and electrically coupled to the second contact region 108.

In some embodiments, the substrate 20 is doped with a dopant of the second conductivity type (e.g., p-type). In some embodiments, the substrate 20 is with a background doping concentration not less than $1 \times 10^{15}$ cm'. In some embodiments, the channel region 52 bay have the same background doping concentration of the substrate 20.

In some embodiments, the second material includes or is composed of a semiconductor material. In some embodiments, the first material includes or is composed of a semiconductor material. In some embodiments, the second material includes or is composed of a Group III-V semiconductor material. In some embodiments, the first material includes or is composed of a Group III-V semiconductor material. The Group III-V semiconductor material may include, but is not limited to, GaAs/AlAs, InP/InGaAs, GaSb/InAs, or InSb. For example, in some embodiments, the second material includes or is composed of InGaAs, and the first material include or is composed of InP. In some embodiments, the second material includes or is composed of a semiconductor material including a Group IV element. For example, Ge, Si or Sn. In some embodiments, the second material includes or is composed of the $Si_xGe_ySn_{1-x-y}$, where $0 \leq x \leq 1$, $0 \leq y \leq 1$, $0 \leq x+y \leq 1$. In some embodiments, the second material includes or is composed of $Ge_{1-a}Sn_a$, where $0 \leq a \leq 0.1$. In some embodiments, the second material includes or is composed of $Ge_xSi_{1-x}$, where $0 \leq x \leq 1$. In some embodiments, the first material includes or is composed of the $Si_xGe_ySn_{1-x-y}$, where $0 \leq x \leq 1$, $0 \leq y \leq 1$, $0 \leq x+y \leq 1$. In some embodiments, the first material includes or is composed of $Ge_{1-a}Sn_a$, where $0 \leq a \leq 0.1$. In some embodiments, the first material includes or is composed of $Ge_xSi_{1-x}$, where $0 \leq x \leq 1$. For example, in some embodiments, the second material includes or is composed of Ge, and the first material include or is composed of Si.

In some embodiments, the optical sensing apparatus e.g., 100a, 100b, 100c, 200a, 200d, 300a, 300c, 300d in the present disclosure further includes an optical element (not shown) over the pixel. In some embodiments, the optical sensing apparatus e.g., 100a, 100b, 100c, 200a, 200d, 300a, 300c, 300d in the present disclosure further includes N optical elements (not shown) over the N pixels respectively. The optical element converges an incoming optical signal to enter the absorption region 10. In some embodiments, the optical elements include lenses.

In some embodiments, p-type dopant includes a group-III element. In some embodiments, p-type dopant is boron. In some embodiments, n-type dopant includes a group-V element. In some embodiments, n-type dopant is phosphorous.

In the present disclosure, the absorption region 10 is configured to absorb photons having a peak wavelength in an invisible wavelength range equal to or greater than 700 nm, such as 850 nm, 940 nm, 1050 nm, 1064 nm, 1310 nm, 1350 nm, or 1550 nm or any suitable wavelength range. In some embodiments, the absorption region 10 receives an optical signal and converts the optical signal into electrical signals. The absorption region 10 can be in anu suitable shape, such as, but not limited to, cylinder, rectangular prism.

In the present disclosure, the absorption region 10 may have a thickness depending on the wavelength of photons to be detected and the material of the absorption region 10. In some embodiments, when the absorption region 10 includes germanium and is designed to absorb photons having a wavelength equal to or greater than 800 nm, the absorption region 10 has a thickness equal to or greater than 0.1 µm. In some embodiments, the absorption region 10 includes germanium and is designed to absorb photons having a wavelength between 700 nm and 2000 nm, the absorption region 10 has a thickness between 0.1 µm and 2.5 µm. In some embodiments, the absorption region 10 has a thickness between 1 µm and 2.5 µm for higher quantum efficiency. In some embodiments, the absorption region 10 may be grown using a blanket epitaxy, a selective epitaxy, or other applicable techniques.

In the present disclosure, the term electrode may include metals or alloys. For example, the first electrode 30, second electrode 60, third electrode 80, include Al, Cu, W, Ti, Ta—TaN—Cu stack or Ti—TiN—W stack.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical sensing apparatus comprising:
   a substrate composed of a first material and having a first surface; and
   one or more pixels supported by the substrate, wherein each of the one or more pixels comprises:
   an absorption region supported by the substrate and composed of a second material, the absorption region configured to receive an optical signal and generate photo-carriers in response to receiving the optical signal;
   a field control region formed in the substrate, wherein the field control region is doped with a first dopant of a first conductivity type;
   a first contact region formed in the substrate for collecting a first type of the photo-carriers, wherein the first contact region is electrically coupled to the field control region and is doped with a second dopant of the first conductivity type;
   a second contact region electrically coupled to the absorption region for collecting a second type of the photo-carriers, wherein the second contact region is doped with a first third dopant of a second conductivity type; and
   a carrier confining region formed in the substrate and between the absorption region and the field control region, wherein the carrier confining region comprises a first barrier region and a channel region, wherein the first barrier region is doped with a fourth dopant of the second conductivity type and has a first peak doping concentration, and wherein the channel region is intrinsic or doped with a fifth dopant of the second conductivity type and has a second peak doping concentration lower than the first peak doping concentration of the first barrier region, wherein the absorption region is doped with a sixth dopant of the second conductivity type, wherein the absorption region, the field control region, and the carrier confining region are formed along the first surface of the substrate, and wherein the channel region is formed between the first barrier region and the first surface of the substrate.

2. The optical sensing apparatus of claim 1, wherein the carrier confining region further comprises a second barrier region doped with a fifth seventh dopant of the second conductivity type and having a third peak doping concentration higher than the second peak doping concentration of the channel region, wherein the channel region is formed between the first barrier region and the second barrier region.

3. The optical sensing apparatus of claim 1, further comprising a protection region formed between the carrier confining region and the first contact region, wherein the protection region is doped with an eighth dopant of the second conductivity type and is configured to repel the first type of the photo-carriers from reaching the first surface of the substrate.

4. The optical sensing apparatus of claim 1, further comprising a counter-doped region surrounding at least a part of the carrier confining region, wherein the counter-doped region is doped with a ninth dopant of the first conductivity type.

5. The optical sensing apparatus of claim 4, further comprising a carrier extraction region formed between the absorption region and the carrier confining region, wherein the carrier extraction region is doped with a tenth dopant of the first conductivity type and is configured to extract the first type of the photo-carriers from the absorption region.

6. The optical sensing apparatus of claim 5, wherein the counter-doped region has a peak doping concentration between a peak doping concentration of the carrier extraction region and a peak doping concentration of the field control region, and wherein the peak doping concentration of the field control region is higher than the peak doping concentration of the counter-doped region.

7. The optical sensing apparatus of claim 1, further comprising one or more third contact regions formed in the carrier confining region, wherein the one or more third contact regions are doped with an eleventh dopant of the second conductivity type.

8. The optical sensing apparatus of claim 7, further comprising a counter-doped region surrounding at least a part of the carrier confining region, wherein the counter-doped region is doped with a twelfth dopant of the first conductivity type and is configured to reduce a leakage current between the carrier confining region and the second contact region.

9. The optical sensing apparatus of claim 8, further comprising a carrier extraction region formed between the absorption region and the carrier confining region, wherein the carrier extraction region is doped with a thirteenth dopant of the first conductivity type and is configured to extract the first type of the photo-carriers from the absorption region.

10. The optical sensing apparatus of claim 9, wherein the counter-doped region has a peak doping concentration between a peak doping concentration of the carrier extraction region and a peak doping concentration of the field control region, wherein the peak doping concentration of the field control region is higher than the peak doping concentration of the counter-doped region.

11. The optical sensing apparatus of claim 7, wherein the one or more third contact regions includes two or more third contact regions, and the optical sensing apparatus further comprising two or more third electrodes each electrically coupled to a respective third contact region of the third contact regions, wherein the two or more third electrodes are configured to apply a constant voltage on the carrier confining region, and wherein a ratio of a distance between two of the third electrodes to a width of the absorption region is not less than 0.5.

12. The optical sensing apparatus of claim 7, further comprising a first electrode coupled to the first contact region and a second electrode coupled to the second contact region, wherein at or above a breakdown voltage applied between the first electrode and the second electrode, the channel region acts as a punch-through region and a region between the carrier confining region and the field control region acts as a breakdown region, such that the optical sensing apparatus functions as an avalanche phototransistor or a single-photon avalanche phototransistor.

13. The optical sensing apparatus of claim 1, wherein the absorption region has a gradient doping profile.

14. The optical sensing apparatus of claim 1, further comprising a first electrode coupled to the first contact region and a second electrode coupled to the second contact region, wherein at or above a breakdown voltage applied between the first electrode and the second electrode, the channel region acts as a punch-through region and a region between the field control region and the carrier confining region acts as a breakdown region, such that the optical sensing apparatus functions as an avalanche photodiode or a single-photon avalanche diode.

15. The optical sensing apparatus of claim 1, further comprising an isolation structure between two adjacent pixels.

16. The optical sensing apparatus of claim 15, wherein the isolation structure is formed on the first surface of the substrate.

17. The optical sensing apparatus of claim 15, wherein the isolation structure is formed on a second surface of the substrate that is opposite to the first surface.

18. The optical sensing apparatus of claim 1, wherein the first conductivity type is n-type, and the second conductivity type is p-type.

19. An optical sensing apparatus comprising:
a substrate composed of a first material and having a first surface; and
one or more pixels supported by the substrate, wherein each of the one or more pixels comprises:
an absorption region supported by the substrate and composed of a second material, the absorption region configured to receive an optical signal and generate photo-carriers in response to receiving the optical signal;
a field control region formed in the substrate, wherein the field control region is doped with a first dopant of a first conductivity type;
a first contact region formed in the substrate for collecting a first type of the photo-carriers, wherein the first contact region is electrically coupled to the field control region and is doped with a second dopant of the first conductivity type;
a second contact region electrically coupled to the absorption region for collecting a second type of the photo-carriers, wherein the second contact region is doped with a first third dopant of a second conductivity type; and
a carrier confining region formed in the substrate and between the absorption region and the field control region, wherein the carrier confining region comprises a first barrier region and a channel region, wherein the first barrier region is doped with a fourth dopant of the second conductivity type and has a first peak doping concentration, and wherein the channel region is intrinsic or doped with a fifth dopant of the second conductivity type and has a second peak doping concentration lower than the first peak doping concentration of the first barrier region,
wherein the absorption region, the field control region, and the carrier confining region are formed along the first surface of the substrate,
wherein the channel region is formed between the first barrier region and the first surface of the substrate, and
wherein the carrier confining region further comprises a second barrier region doped with a sixth dopant of the second conductivity type and having a third peak doping concentration higher than the second peak doping concentration of the channel region, wherein the channel region is formed between the first barrier region and the second barrier region.

20. An optical sensing apparatus comprising:
a substrate composed of a first material and having a first surface; and
one or more pixels supported by the substrate, wherein each of the one or more pixels comprises:
an absorption region supported by the substrate and composed of a second material, the absorption region configured to receive an optical signal and generate photo-carriers in response to receiving the optical signal;
a field control region formed in the substrate, wherein the field control region is doped with a first dopant of a first conductivity type;
a first contact region formed in the substrate for collecting a first type of the photo-carriers, wherein the first contact region is electrically coupled to the field control region and is doped with a second dopant of the first conductivity type;
a second contact region electrically coupled to the absorption region for collecting a second type of the photo-carriers, wherein the second contact region is doped with a first third dopant of a second conductivity type;
a carrier confining region formed in the substrate and between the absorption region and the field control region, wherein the carrier confining region comprises a first barrier region and a channel region, wherein the first barrier region is doped with a fourth dopant of the second conductivity type and has a first peak doping concentration, wherein the channel region is intrinsic or doped with a fifth dopant of the second conductivity type and has a second peak doping concentration lower than the first peak doping concentration of the first barrier region, wherein the absorption region, the field control region, and the carrier confining region are formed along the first surface of the substrate, and wherein the channel region is formed between the first barrier region and the first surface of the substrate; and
a protection region formed between the carrier confining region and the first contact region, wherein the protection region is doped with a sixth dopant of the second conductivity type and is configured to repel the first type of the photo-carriers from reaching the first surface of the substrate.

* * * * *